(12) United States Patent
Katsumata et al.

(10) Patent No.: US 7,768,063 B2
(45) Date of Patent: Aug. 3, 2010

(54) SEMICONDUCTOR DEVICE AND METHOD OF MANUFACTURING THE SAME

(75) Inventors: Ryota Katsumata, Kanagawa-ken (JP);
Masaru Kito, Kanagawa-ken (JP);
Yoshiaki Fukuzumi, Kanagawa-ken (JP); Masaru Kidoh, Tokyo (JP);
Hiroyasu Tanaka, Tokyo (JP); Hideaki Aochi, Kanagawa-ken (JP); Yasuyuki Matsuoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/248,577

(22) Filed: Oct. 9, 2008

(65) Prior Publication Data
US 2009/0101969 A1    Apr. 23, 2009

(30) Foreign Application Priority Data
Oct. 10, 2007    (JP)    ............................ 2007-264858

(51) Int. Cl.
*H01L 29/94*    (2006.01)
(52) U.S. Cl. .............................. 257/329; 257/E29.262; 257/E21.41
(58) Field of Classification Search ................ 257/329, 257/E29.262, E21.41; 438/268
See application file for complete search history.

(56) References Cited
U.S. PATENT DOCUMENTS

| | | | |
|---|---|---|---|
| 5,414,289 A * | 5/1995 | Fitch et al. ................... | 257/329 |
| 5,599,724 A | 2/1997 | Yoshida | |
| 5,707,885 A | 1/1998 | Lim | |
| 5,994,735 A * | 11/1999 | Maeda et al. ................ | 257/329 |
| 2007/0252201 A1 | 11/2007 | Kito et al. | |
| 2008/0067583 A1 | 3/2008 | Kidoh et al. | |
| 2008/0180994 A1 | 8/2008 | Katsumata et al. | |
| 2008/0186771 A1 | 8/2008 | Katsumata et al. | |

* cited by examiner

*Primary Examiner*—Zandra Smith
*Assistant Examiner*—Paul E Patton
(74) *Attorney, Agent, or Firm*—Oblon, Spivak, McClelland, Maier & Neustadt, L.L.P.

(57) ABSTRACT

A semiconductor device comprising: a semiconductor substrate; a first conductive layer provided on a surface of the substrate and serving as one of a source and a drain; a first insulating film provided on the first conductive layer; a gate electrode film provided on the first insulating film; a second insulating film provided on the gate electrode film; a gate opening provided so as to penetrate the second insulating film, the gate electrode film and the first insulating film to expose a part of the first conductive layer; a recess provided in the surface of the first conductive layer just below the gate opening; a gate insulator provided on the side surface of the gate opening and having a projecting shape at a portion between the first insulating film and the recess; a second conductive layer buried in the recess and in a bottom of the gate opening so as to be in contact with the gate insulator.

5 Claims, 8 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-264858, filed Oct. 10, 2007, the entire contents of which are incorporated herein by reference.

BACKGROUND OF THE INVENTION

1. Field of the Invention

The present invention relates to a vertical insulated gate field effect transistor.

2. Description of the Related Art

Miniaturization of semiconductor devices in a planar direction is required in order to increase the integration degree of a semiconductor integrated circuit (LSI) such as a memory using planar transistors formed on a semiconductor substrate and SoC (System on a chip). The miniaturization in the planar direction has a physical limitation due to limitation of lithography. Therefore, various types of vertical transistors which each include an active region vertically formed on a semiconductor substrate have been proposed as a method of increasing the integration degree of an LSI (refer to, for example, U.S. Pat. No. 5,308,778).

As a result of the increase in the integration degree of vertical transistors described in U.S. Pat. No. 5,308,778 and the like, the cross-sectional diameter of the vertical transistor is reduced, and accordingly a contact area between the transistor and the semiconductor substrate, for example, a source contact area is also reduced. Consequently, a problem of an increase in a contact resistance is raised.

The present invention provides a semiconductor device which allows the source contact resistance to be reduced by increasing the source contact area and a method of manufacturing the same.

SUMMARY OF THE INVENTION

According to an aspect of the present invention, there is provided a semiconductor device comprising: a semiconductor substrate; a first conductive layer provided on a surface of the semiconductor substrate and serving as one of a source and a drain; a first interlayer insulating film provided on the first conductive layer; a gate electrode film provided on the first interlayer insulating film; a second interlayer insulating film provided on the gate electrode film; a gate opening provided so as to penetrate the second interlayer insulating film, the gate electrode film and the first interlayer insulating film to expose a part of the first conductive layer; a recess provided in the surface of the first conductive layer just below the gate opening; a gate insulating film provided on the side surface of the gate opening and having a projecting shape at a portion between the first interlayer insulating film and the recess; a second conductive layer buried in the recess and in a bottom of the gate opening so as to be in contact with the gate insulating film, and serving as the one of the source and the drain while being in contact with the first conductive layer; a channel which is buried in the gate opening above the second conductive layer so as to face the gate electrode film with the gate insulating film therebetween, and which has a channel layer generated therein, the channel layer allowing majority carriers to flow between the source and the drain in response to a voltage applied to the gate; and a third conductive layer buried in the gate opening above the channel so as to be in contact with the gate insulating film to serve as the other one of the source and the drain.

According to another aspect of the present invention, there is provided a method of manufacturing a vertical semiconductor device, the semiconductor device including a source, a channel and a drain buried in a gate opening penetrating a first interlayer insulating film, a gate electrode film and a second interlayer insulating film which are laminated on a semiconductor substrate, the method comprising the steps of: forming a first source layer on the surface of the semiconductor substrate; forming the first interlayer insulating film, the gate electrode film and the second interlayer insulating film on the first source layer and the semiconductor substrate in a laminated structure, and forming a gate opening penetrating the first interlayer insulating film, the gate electrode film and the second interlayer insulating film on the first source layer to expose a part of the surface of the first source layer; forming a gate insulating film and a protective film in a laminated structure on the side surface of the gate opening; etching the surface of the first source layer exposed from the gate opening to form a recess in the surface of the first source layer; burying a silicon film in the recess and the gate opening; and forming a drain layer on the silicon film and a second source layer in contact with the first source layer under the silicon layer to form the channel in the silicon film between the drain layer and the second source layer.

BRIEF DESCRIPTION OF THE PREFERRED EMBODIMENTS

The present invention provides a semiconductor device which allows the source contact resistance to be reduced by increasing the source contact area and a method of manufacturing the same.

Embodiments of the present invention will be described below with reference to drawings.

Embodiment 1

Figure 1:
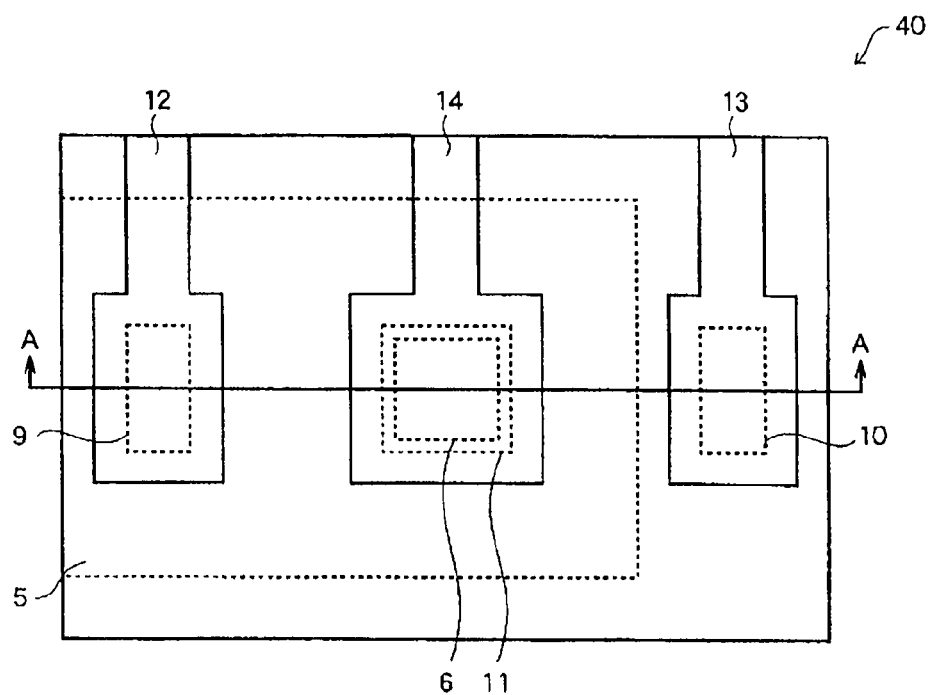
FIG. 1 is a plan view showing a semiconductor device according to Embodiment 1 of the present invention.
Figure 2:
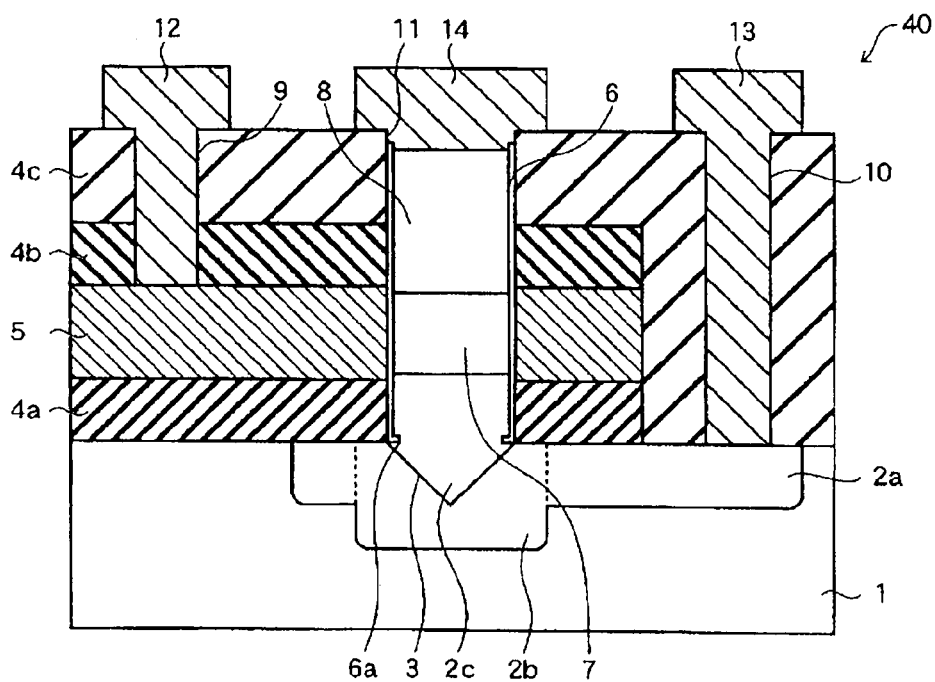
FIG. 2 is a cross-sectional view taken along line A-A of FIG. 1.

Firstly, the semiconductor device and a method of manufacturing the same according to Embodiment 1 of the present invention will be described with reference to drawings. FIG. 1 is a plan view showing the semiconductor device. FIG. 2 is a cross-sectional view taken along line A-A' of FIG. 1. In the present embodiment, the source contact area of a vertical insulated gate field effect transistor is increased.

As shown in FIG. 1, in a semiconductor device 40, a gate contact 9 is provided on a gate electrode film 5 and a gate wiring 12 is connected to the gate electrode film 5 via the gate contact 9. A gate insulating film 6 is provided in a square-shaped opening in the gate electrode film 5. A drain contact 11 is provided above the square-shaped opened portion in the gate electrode film 5. A drain wiring 14 connected to the drain contact 11 is provided so as to cover the gate insulating film 6 and the drain contact 11. A source contact 10 is provided spaced apart from the gate electrode film 5. A source wiring 13 connected to the source contact 10 is provided so as to cover the source contact 10. The semiconductor device 40 is a vertical insulated gate field effect transistor having a square-shaped gate. Here, an insulated gate field effect transistor refers to a metal insulator semiconductor field effect transistor (MISFET), or metal oxide semiconductor field effect transistor (MOSFET). Hereinafter, a vertical insulated gate field effect transistor is abbreviated to a vertical transistor.

As shown in FIG. 2, a first source layer 2a is provided as a conductive layer in the top of the semiconductor substrate 1 and a second source layer 2b is provided in the first source layer 2a as a conductive layer with a larger depth than that of the first source layer 2a. A square pyramid-shaped recess 3 having the bottom surface parallel to the surface of the semiconductor substrate 1 and the top inside the semiconductor substrate 1 is provided above the second source layer 2b.

A first interlayer insulating film 4a, the gate electrode film 5 and a second interlayer insulating film 4b are selectively formed in a laminated structure above the semiconductor substrate 1 (on the first main surface). The first interlayer insulating film 4a provides insulation between the semiconductor substrate 1 and the gate electrode film 5. The second interlayer insulating film 4b provides insulation between the gate electrode film 5 and the wirings such as the source wiring 13 and the drain wiring 12. A third interlayer insulating film 4c is provided on portions of the semiconductor substrate 1 on which the first interlayer insulating film 4a, the gate electrode film 5 and the second interlayer insulating film 4b are not provided as well as on the second interlayer insulating film 4b.

A square-prism-shaped gate opening formed by etching the first interlayer insulating film 4a, the gate electrode film 5, the second interlayer insulating film 4b and the third interlayer insulating film 4c is provided on the recess 3. The gate insulating film 6 is provided on the side surface of the gate opening formed by etching. A gate insulating film protrusion 6a horizontally projecting in the drawing is provided in a contact portion between the first interlayer insulating film 4a and the recess 3.

A third source layer 2c serving as a conductive layer, a channel 7, and a drain layer 8 serving as a conductive layer are buried in a laminated structure in the gate opening which is formed by etching and has the gate insulating film 6 on the side surface thereof. The third source layer 2c is buried in the gate opening on the recess 3 such that the lower portion thereof is in contact with the second source layer 2b and such that the upper surface thereof extends to the gate electrode film 5 beyond the boundary between the first interlayer insulating film 4a and the gate electrode film 5. The portion of the third source layer 2c buried in the gate opening (the third source layer 2c) is contact with the gate insulating film 6 and the gate insulating film protrusion 6a.

The channel 7 is buried on the third source layer 2c in the gate opening such that the side surface of the channel 7 is in contact with the gate electrode film 5 via the gate insulating film 6. Accordingly, a channel layer which allows the majority carriers to flow between the source and the drain by a voltage applied on the gate is generated.

The drain layer 8 is buried in the gate opening such that the lower portion thereof extends to the gate electrode film 5 beyond the boundary between the gate electrode film 5 and the second interlayer insulating film 4b and such that the side surface thereof is in contact with the gate insulating film 6 on the channel 7. The gate of the semiconductor device 40 (vertical transistor) is of a square prism shape.

A gate contact 9 opened by etching the second interlayer insulating film 4b and the third interlayer insulating film 4c is provided on the gate electrode film 5. A gate wiring 12 connected to the gate electrode film 5 is provided in the gate contact 9. A drain contact 11 is provided on the gate insulating film 6 and the drain layer 8. A drain wiring 14 connected to the drain layer 8 is provided in the drain contact 11. A source contact 10 opened by etching the third interlayer insulating film 4c is provided on the first source layer 2a. Then, a source wiring 13 contacted to the first source layer 2a is provided.

A method of manufacturing a semiconductor device will then be described with reference to FIGS. 3 to 12. FIGS. 3 to 12 are a cross-sectional view showing processes of manufacturing a semiconductor device.

Figure 3:
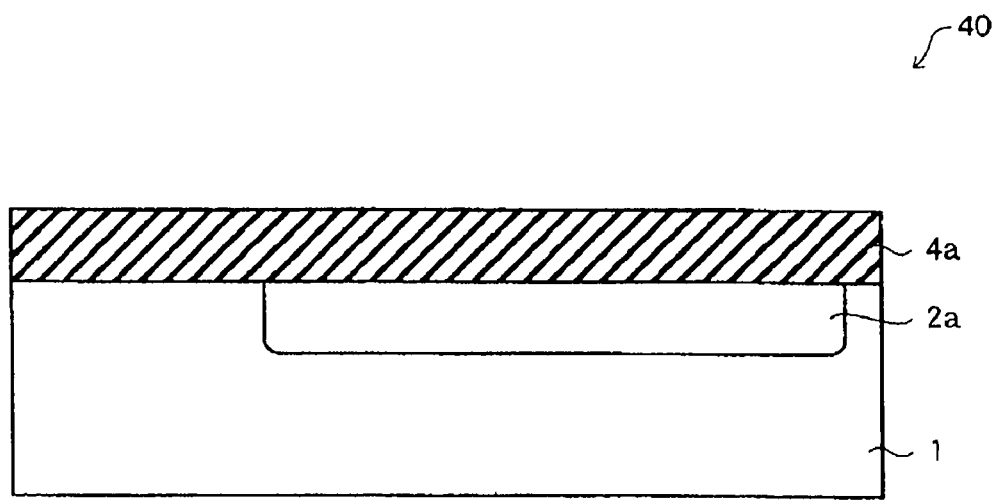
FIG. 3 is a cross-sectional view showing a method of manufacturing the semiconductor device according to Embodiment 1 of the present invention.

As shown in FIG. 3, a thermal oxide film (for example, having a thickness of 10 nm) is first formed on a silicon semiconductor substrate 1 having, for example, a plane direction (100). Arsenic (As) is selectively ion-implanted (for example, at an acceleration voltage of 30 KeV, in a dose of 3e15/cm2) in the semiconductor substrate 1 via the thermal oxide film. Heat treatment (for example, Rapid Thermal Annealing (RTA) at 1030° C., and for 20 seconds) is carried out to form the first source layer 2a. The thermal oxide film is peeled off, and then the first interlayer insulating film 4a is formed on the semiconductor substrate 1. A laminated film formed by sequentially laminating, for example, a thermal oxide film, a silicon nitride film (SiN film), and a CVD silicon oxide film formed by using a vapor deposition method (CVD method) is used as the first interlayer insulating film 4a.

Figure 4:
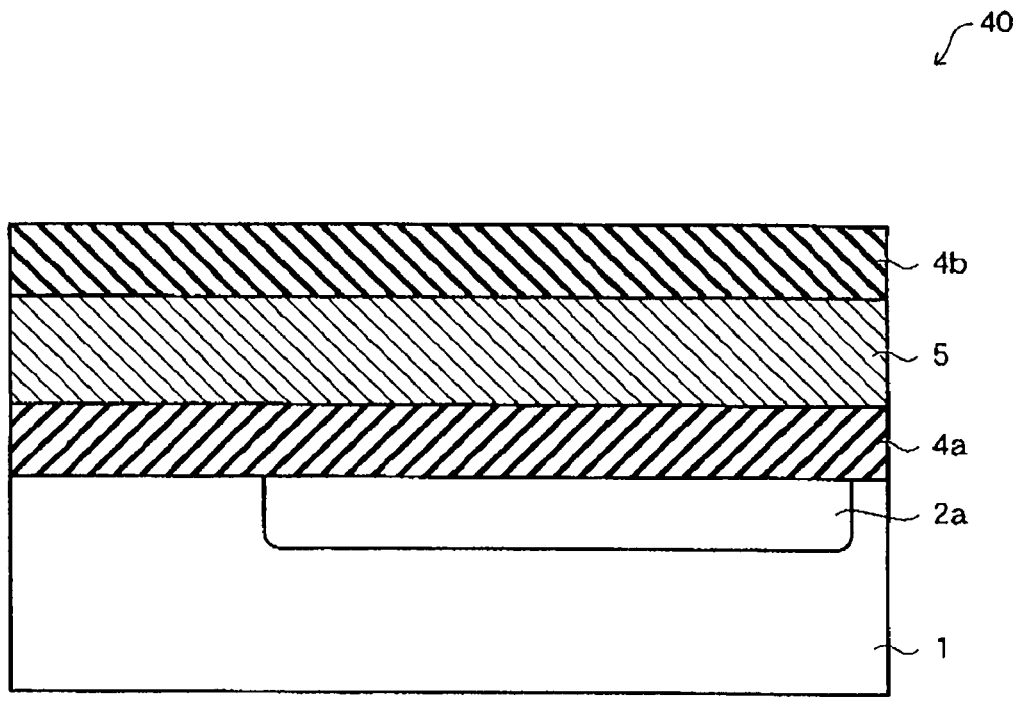
FIG. 4 is a cross-sectional view showing a method of manufacturing the semiconductor device according to Embodiment 1 of the present invention.

As shown in FIG. 4, on the first interlayer insulating film 4a, the gate electrode film 5, and the second interlayer insulating film 4b are then sequentially formed in a laminated structure. For example, an amorphous silicon film (for example, having a thickness of 200 nm) doped with boron and formed by using the vapor deposition method (CVD method) is used as the gate electrode film 5. A laminated film formed by laminating, for example, a CVD silicon oxide film and a silicon nitride film (SiN film) formed by using a vapor deposition method (CVD method) is used as the second interlayer insulating film 4b.

Figure 5:
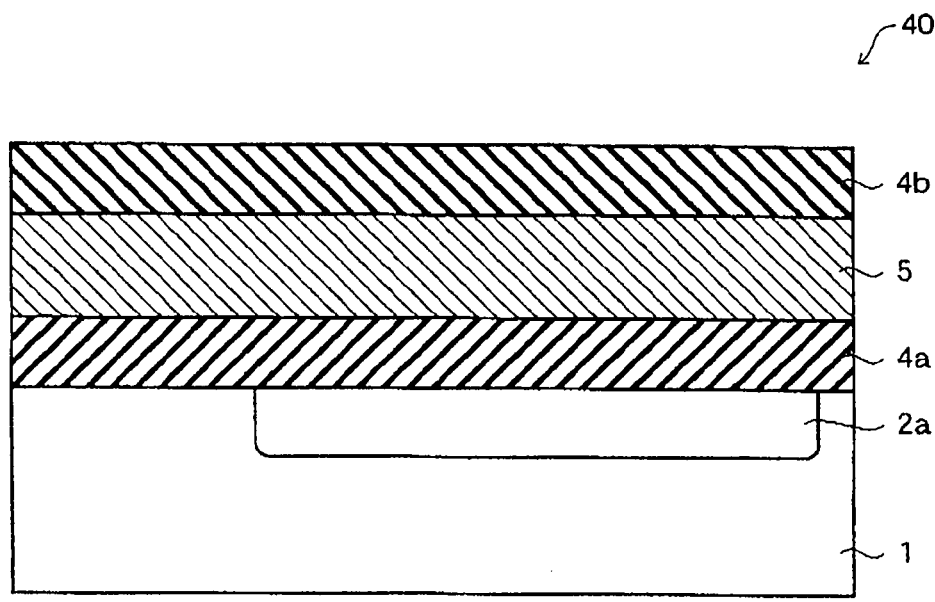
FIG. 5 is a cross-sectional view showing a method of manufacturing the semiconductor device according to Embodiment 1 of the present invention.

As shown in FIG. 5, a resist film is then patterned by using a known lithography method. Subsequently, the resist film is used as a mask to form a gate electrode region by etching the second interlayer insulating film 4b, the gate electrode film 5, and the first interlayer insulating film 4a using, for example, an reactive ion etching (RIE) method. After removing the resist film, the interlayer insulating films are deposited and flattened using chemical mechanical polishing (CMP) method. Then, the interlayer insulating films are deposited again to form the third interlayer insulating film 4c.

Figure 6:
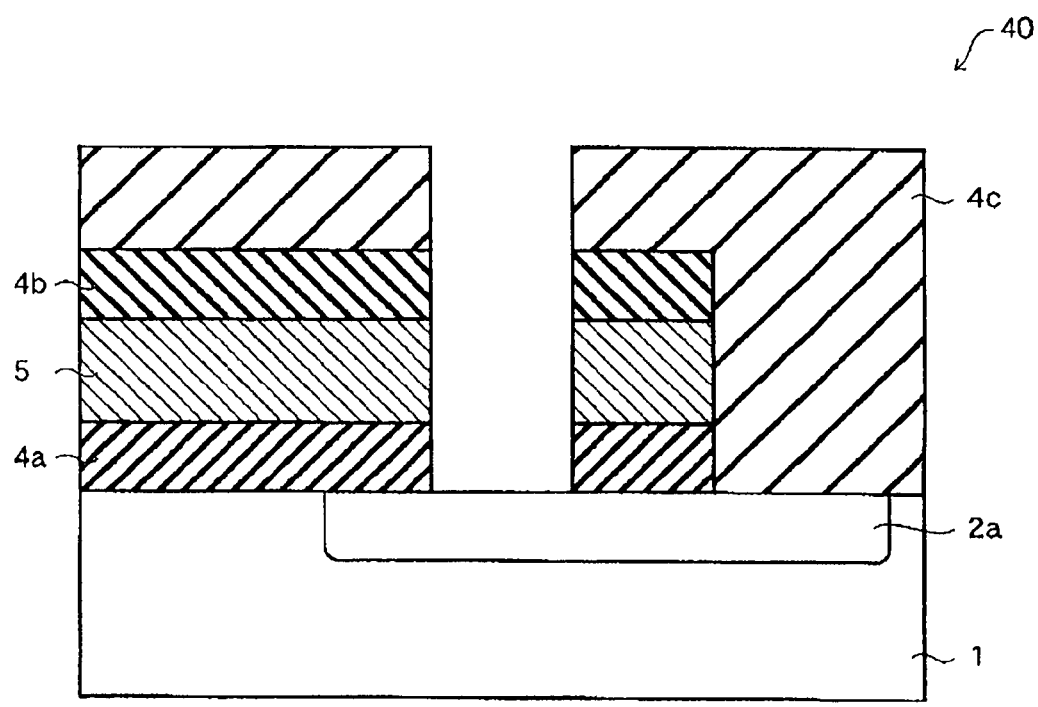
FIG. 6 is a cross-sectional view showing a method of manufacturing the semiconductor device according to Embodiment 1 of the present invention.

As shown in FIG. 6, a resist film is then patterned by using a known lithography method. Subsequently, the resist film is used as a mask to form a gate opening serving as a gate region on the first source layer 2a by etching the third interlayer insulating film 4c, the second interlayer insulating film 4b, the gate electrode film 5, and the first interlayer insulating film 4a using, for example, an RIE method. After removing the resist film, a damage layer generated due to the RIE method on the opened and exposed semiconductor substrate 1 is removed by etching using, for example, a dry gas process.

Figure 7:
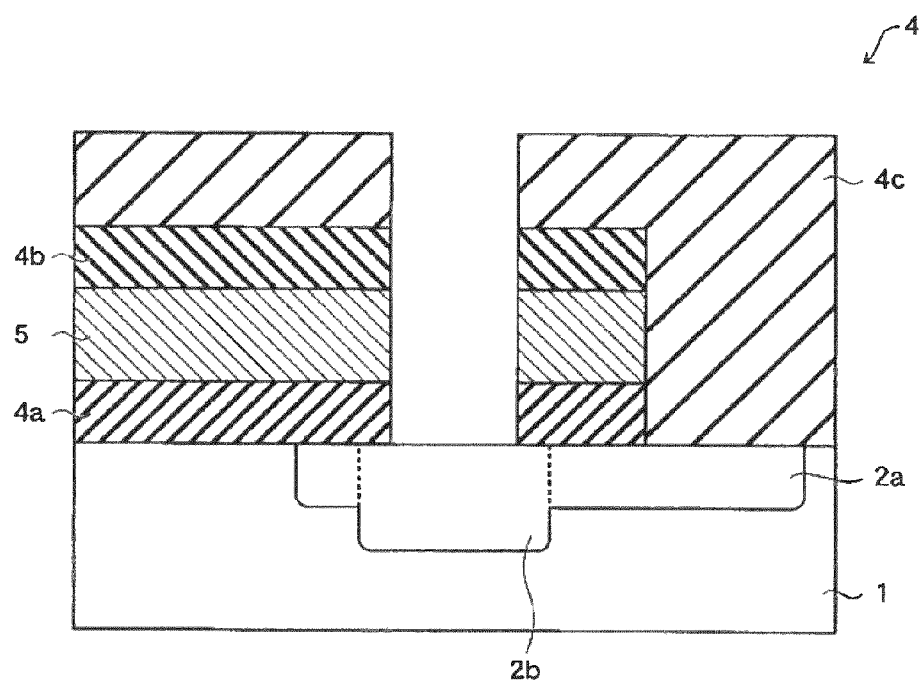
FIG. 7 is a cross-sectional view showing a method of manufacturing the semiconductor device according to Embodiment 1 of the present invention.

As shown in FIG. 7, the gate opening serving as a gate region is then ion-implanted with arsenic (As). Heat treatment (for example, RTA treatment) is carried out to form the second source layer 2b having a diffusion depth larger than that of the first source layer 2a. Consequently, the surface of the semiconductor substrate 1 in the opening serving as a gate region in which the second source layer 2b is formed has a higher ion concentration than the other region.

Figure 8:
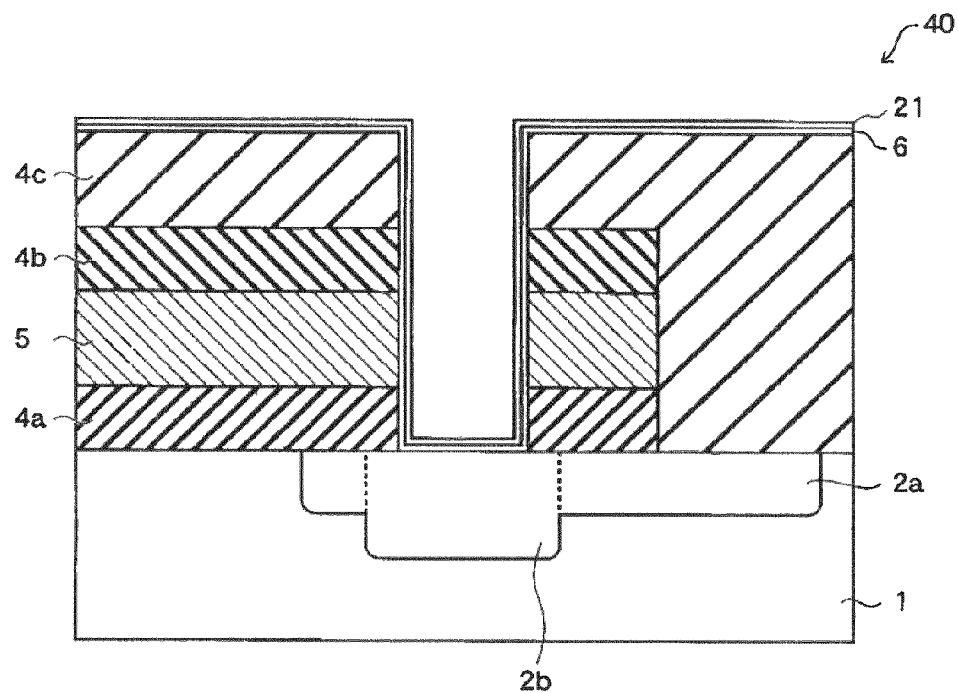
FIG. 8 is a cross-sectional view showing a method of manufacturing the semiconductor device according to Embodiment 1 of the present invention.

Subsequently, as shown in FIG. 8, a gate insulating film 6 and a protective film 21 are formed on the bottom surface and side surface of the gate opening to be a gate region and on the third interlayer insulating film 4c, by using a vapor deposition method (CVD method). The protective film 21 protects the gate insulating film 6 in subsequent processes and employs for example an amorphous silicon film formed by a vapor deposition method (CVD method).

Figure 9:
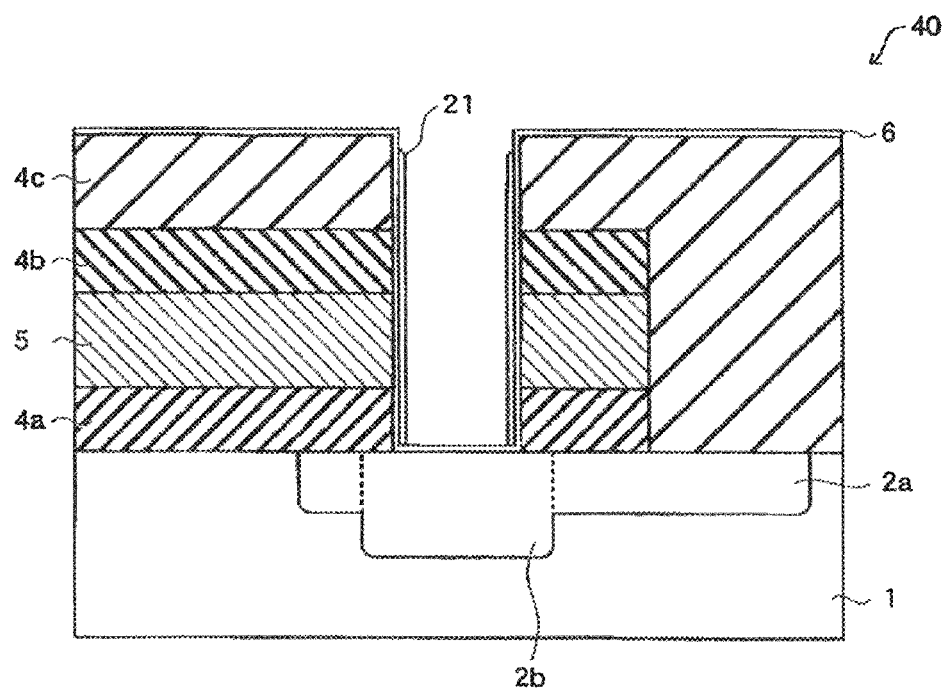
FIG. 9 is a cross-sectional view showing a method of manufacturing the semiconductor device according to Embodiment 1 of the present invention.

Then, as shown in FIG. 9, the protective film 21 on the bottom surface of the gate opening to be a gate region and on the third interlayer insulating film 4c is selectively etched by using for example an RIE method to cause the protective film 21 on the side surface of the opening to be a gate region to remain in a spacer-like shape. Here, little of the gate insulating films 6 on the bottom surface of the gate opening to be a gate region and on the third interlayer insulating film 4c are etched, since conditions in which the etching rate of the protective film 21 is higher (large selection ratio) than that of the gate insulating film 6 are employed.

Figure 10:
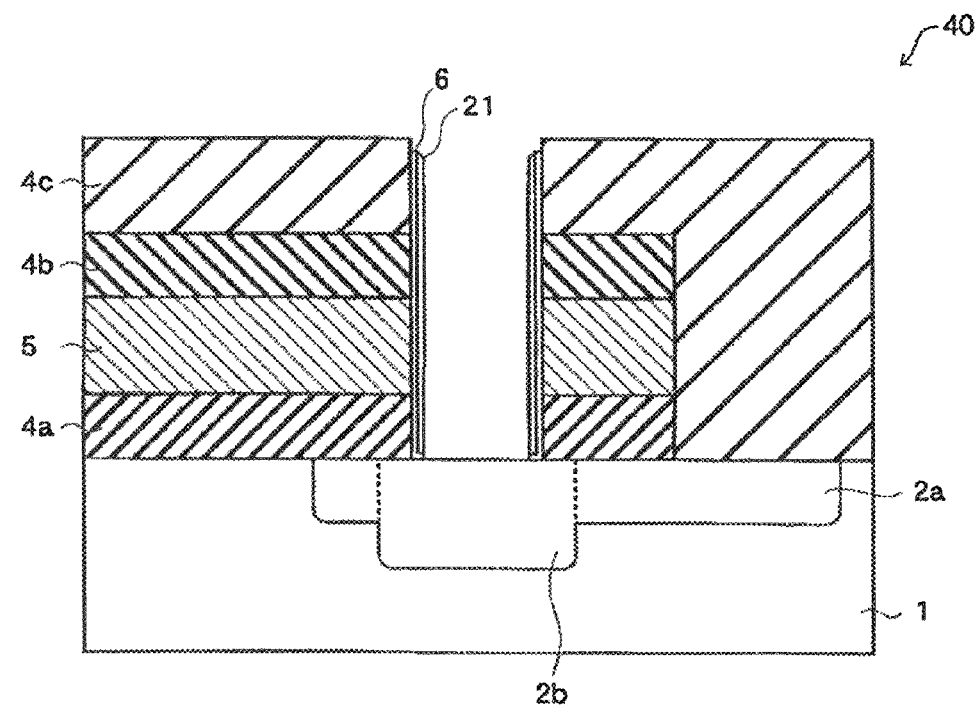
FIG. 10 is a cross-sectional view showing a method of manufacturing the semiconductor device according to Embodiment 1 of the present invention.

As shown in FIG. 10, the gate insulating films 6 on the bottom surface of the gate opening to be a gate region and on the third interlayer insulating film 4c are then removed by a wet-etching process (for example, using a diluted hydrofluoric acid). A wet-etching process is here used but a dry-etching process may be used. In that case, the conditions that the etching rate of the gate insulating film 6 is higher (large selection ratio) than that of the protective film 21 are preferably employed.

Figure 11:
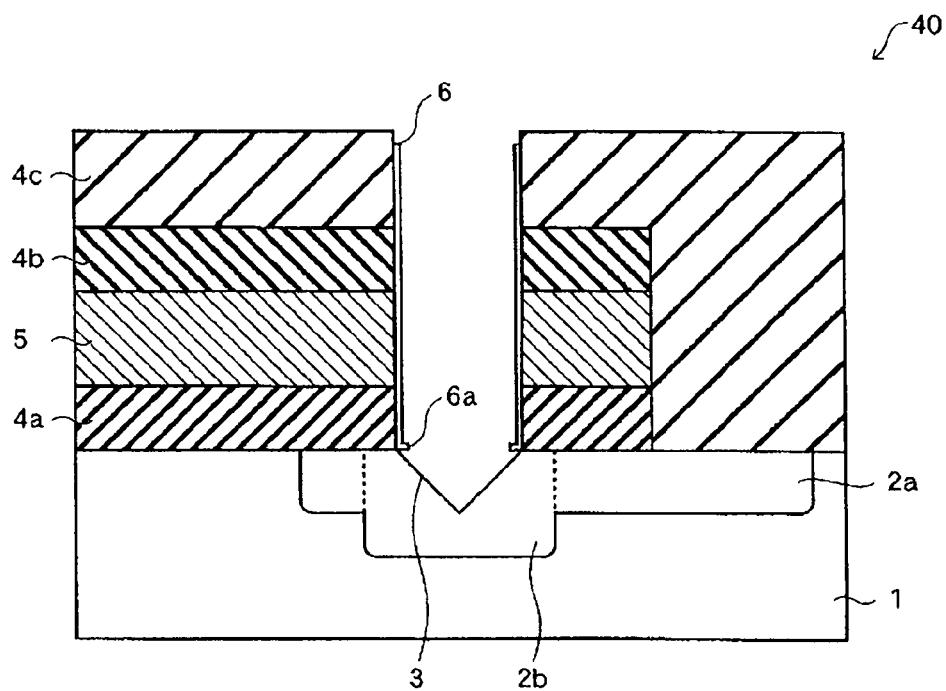
FIG. 11 is a cross-sectional view showing a method of manufacturing the semiconductor device according to Embodiment 1 of the present invention.

As shown in FIG. 11, the spacer-like shaped protective film 21 and the bottom surface of the gate opening to be a gate region are etched by using a tetramethylammonium hydroxide (TMAH) process. In the TMAH process, the etching rates of silicon oxide film and the like are very small compared to silicon and the etching rate of silicon is dependent on the plane direction of the silicon. For example, under conditions including 20% by weight of TMAH and at 79.8° C., the etching rate of the plane direction (111) is so small that it is 0.027 times the etching rate of the plane direction (100). Consequently, the etched portion (the recess 3) in the bottom surface of the gate opening to be a gate region is of a square pyramid shape with (111) planes on the etching surfaces. The TMAH process is here used but an alkaline process using KOH and the like may be used. As a result of the formation of the recess 3, the gate insulating film protrusion 6a with a thickness corresponding to that of the protective film 21 is formed in the gate insulating film 6 at the edge of the semiconductor substrate 1 side.

Figure 12:
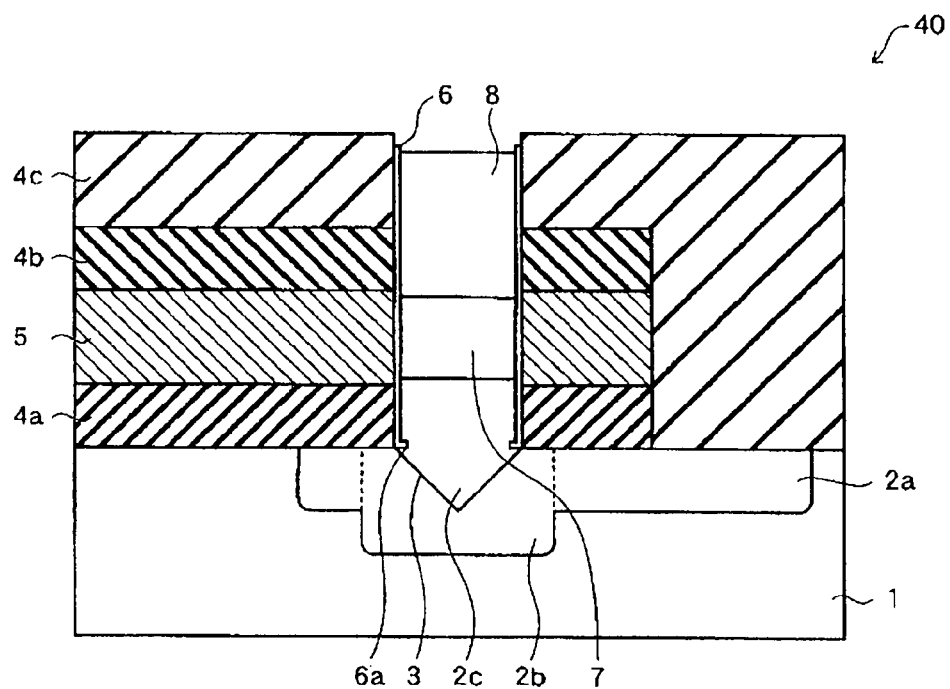
FIG. 12 is a cross-sectional view showing a method of manufacturing the semiconductor device according to Embodiment 1 of the present invention.

As shown in FIG. 12, an amorphous silicon film which is to serve as the body of the vertical transistor is then deposited so as to cover the recess 3 and the gate opening by using, for example, a vapor deposition method (CVD method). After the deposition, the amorphous silicon film is etched back by using, for example, RIE method to leave the amorphous silicon film in the recess 3 and the gate opening. This amorphous silicon film is ion-implanted (an acceleration voltage of 40 KeV, a dose of 3e15/cm$^2$ and an acceleration voltage of 140 KeV, a dose of 1e14/cm$^2$) with, for example, arsenic (As). Heat treatment is carried out (for example, 950° C., RTA for 10 seconds) to form the drain layer 8. At this time, arsenic (As) is upwardly diffused from the second source layer 2b to form the third source layer 2c.

Then, a source contact and a gate contact, not shown, are formed. A barrier metal and a wiring metal are deposited thereon. A resist film is patterned by using a known lithography method. The resist film is used as a mask to form a gate wiring 12, a source wiring 13 and a drain wiring 14 by etching the barrier metal and the wiring metal.

Subsequently, an interlayer insulating film and a multi-layered wiring layer, not shown, following the third interlayer insulating film 4c are formed by using a known technology to complete the semiconductor device 40 having a multi-layered wiring structure.

As described above, in the semiconductor device and method of manufacturing the same of the present invention, the first source layer 2a is provided in the top of the semiconductor substrate 1, and in the first source layer 2a is provided the second source layer 2b having a larger depth than that of the first source layer 2a and having on the top surface side thereof a recess 3 of an inverted square pyramid shape with the width getting gradually narrowed inwardly from the surface of the semiconductor substrate 1. Above the recess 3, the gate opening is provided so as to penetrate the first interlayer insulating film 4a, the gate electrode film 5 and the second interlayer insulating film 4b which have been laminated. The gate insulating films 6 are provided on the side surfaces of the gate opening. The gate insulating film protrusion 6a having a projecting shape is provided in the contact portion between the first interlayer insulating film 4a and the recess 3. The third source layer 2c, a channel 7 and a drain layer 8 are buried in a laminated structure in the gate opening which is provided with the gate insulating film 6 on the side surface thereof. The gate insulating film 6 formed on the side surface of the gate opening is covered by the protective film 21 until an amorphous silicon film is buried in the gate opening.

This allows the source contact area to be increased than before. Accordingly, the source contact resistance of a vertical transistor can be reduced. In addition, the gate insulating film 6 is protected by the protective film 21 during processes, resulting in reduction in damage on the gate insulating film.

In the present embodiment, the gate of the vertical transistor is of a square prism shape, but may alternatively be of a cylindrical column or a polygonal column shape other than a square prism shape. An insulating film formed by a vapor deposition method is used for the gate electrode film. An insulating film formed by a vapor deposition method may be provided on a silicon thermal oxide film (gate oxide film) formed by oxidizing the gate electrode film 5 at a high temperature on the side surface thereof to cause the gate insulating film on the side of the gate electrode film 5 to be in a laminated structure. Moreover, the source of the vertical transistor is provided on the surface of the semiconductor substrate 1. A drain is provided in the upper portion of the gate opening. Alternatively, a source and a drain may be provided in the upper portion of the gate opening and on the surface of the semiconductor substrate 1, respectively.

Embodiment 2

Figure 13:
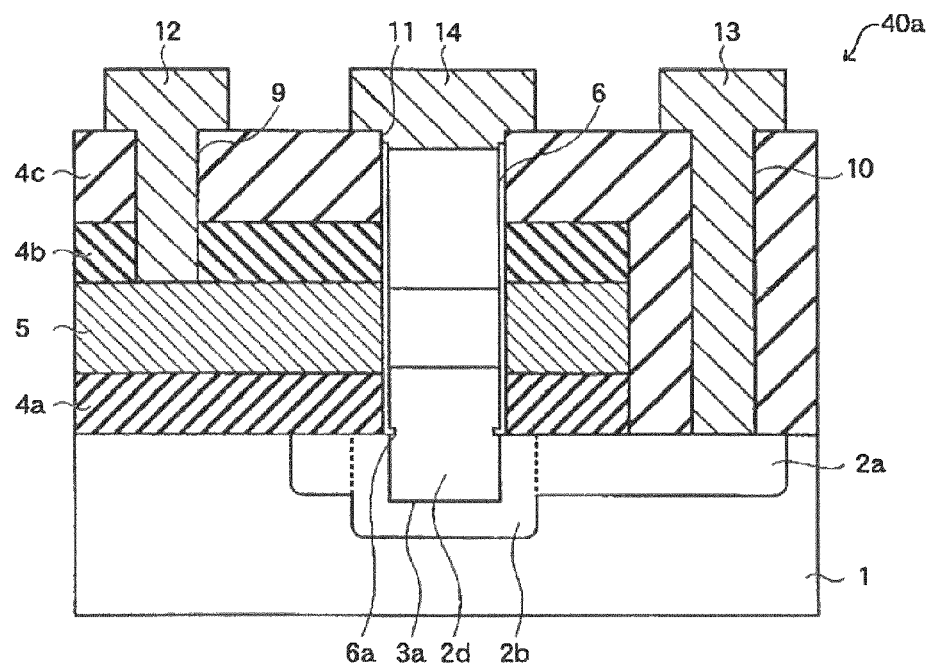
FIG. 13 is a cross-sectional view showing a method of manufacturing the semiconductor device according to Embodiment 2 of the present invention.

A semiconductor device and method of manufacturing the same according to Embodiment 2 of the present invention will then be described with reference to drawings. FIG. 13 is a cross-sectional view showing the semiconductor device. In the present embodiment, the shape of a source contact of the vertical insulated gate field effect transistor is modified.

As shown in FIG. 13, in a semiconductor device 40a, a first source layer 2a is provided in the top of a semiconductor substrate 1 and a second source layer 2b having a larger depth than that of the first source layer 2a is provided in the first source layer 2a. A square prism-shaped recess 3a having the bottom surface parallel to the surface of the semiconductor substrate 1 and the top inside the semiconductor substrate 1 is provided in the upper portion of the second source layer 2b.

On the top surface of the semiconductor substrate 1 (the first main surface), a first interlayer insulating film 4a, a gate electrode film 5 and a second interlayer insulating film 4b are selectively formed in a laminated structure. The first interlayer insulating film 4a provides insulation between the semiconductor substrate 1 and the gate electrode film 5. The second interlayer insulating film 4b provides insulation between the gate electrode film 5 and wirings such as a source wiring 13 and a drain wiring 14. A third interlayer insulating film 4c is provided on the top surface of the semiconductor substrate 1 (the first main surface) on which the first interlayer insulating film 4a, the gate electrode film 5 and the second interlayer insulating film 4b are not provided and on the second interlayer insulating film 4b.

A square-prism-shaped gate opening is provided above the recess 3a. Specifically, the square-prism-shaped gate opening is formed by etching the first interlayer insulating film 4a, the gate electrode film 5, the second interlayer insulating film 4b and the third interlayer insulating film 4c. A gate insulating film 6 is provided on the side surface of the gate opening formed by etching. The square-prism-shaped recess 3a is provided just below the gate opening. A gate insulating film protrusion 6a having a shape horizontally projecting in the figure is provided in the contact portion between the first interlayer insulating film 4a and the recess 3a.

After the gate opening is formed by etching and provided with the gate insulating film 6 on the side surface thereof, a laminated structure of a third source layer 2d, a channel 7 and a drain layer 8 is buried in the gate opening. The third source layer 2d is buried on the recess 3a and in the gate opening such that the bottom of the third source layer 2d is in contact with the second source layer 2b and the top of the third source layer 2d extends beyond the boundary between the first interlayer insulating film 4a and the gate electrode film 5 to the gate electrode film 5. The portion buried in the gate opening (the third source layer 2d) is in contact with the gate insulating film 6 and the gate insulating film protrusion 6a.

The channel 7 is buried on the third source layer 2d and in the gate opening such that the side surface of the channel 7 is in contact with the gate electrode film via the gate insulating film 6. Accordingly, a channel layer in which the majority carriers flow between the source and the drain by a voltage applied to the gate is generated.

The drain layer 8 is buried on the channel 7 and in the gate opening such that the bottom of the drain layer 8 extends beyond the boundary between the gate electrode film 5 and the second interlayer insulating film 4b to the gate electrode film 5 and that the side surface of the drain layer 8 is in contact with the gate insulating film 6. The gate of the semiconductor device 40a (vertical transistor) is of a square prism shape.

A gate contact 9 formed by etching the second interlayer insulating film 4b and the third interlayer insulating film 4c is provided on the gate electrode film 5. A gate wiring 12 in contact with the gate electrode film 5 is provided in the gate contact 9. A drain contact 11 is provided on the gate insulating film 6 and the drain layer 8. A drain wiring in contact with the drain layer 8 is provided in the drain contact 11. A source contact 10 formed by etching the third interlayer insulating film 4c is provided on the first source layer 2a. A source wiring 13 in contact with the first source layer 2a is provided in the source contact 10.

Here, the recess 3a and the gate opening are of a square prism shape and may alternatively be of a polygonal prism shape other than a square prism shape or of a circular column shape.

Figure 14:
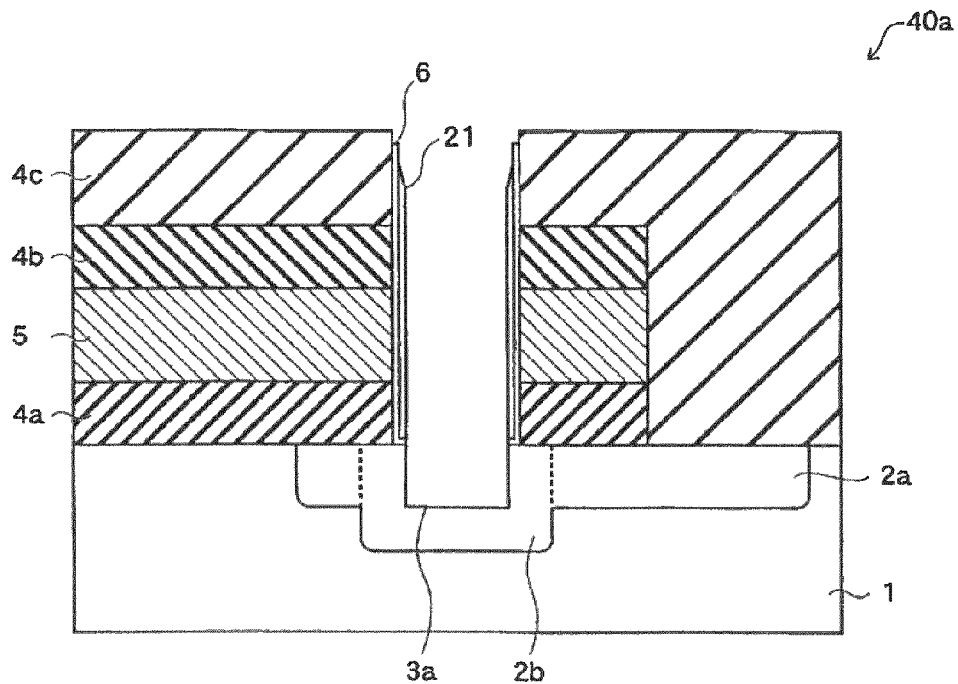
FIG. 14 is a cross-sectional view showing a method of manufacturing the semiconductor device according to Embodiment of the present invention.
Figure 15:
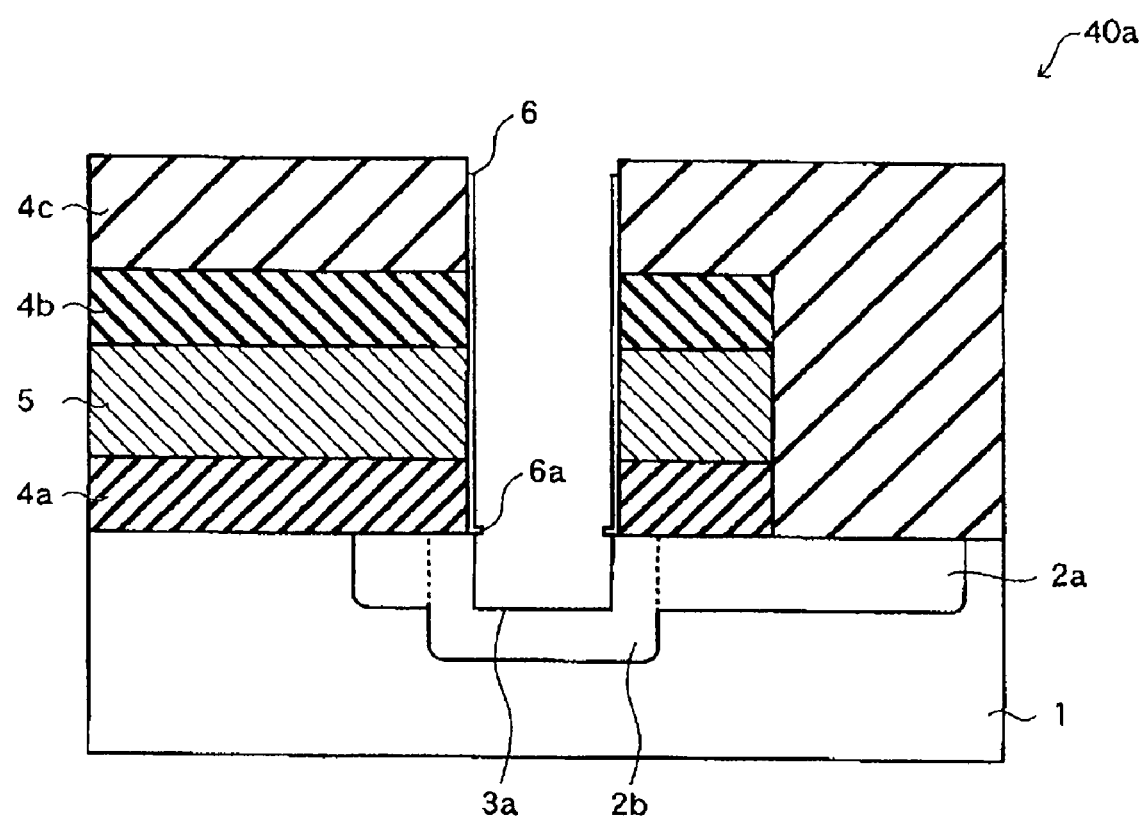
FIG. 15 is a cross-sectional view showing a method of manufacturing the semiconductor device according to Embodiment 2 of the present invention.

A method of manufacturing a semiconductor device will then be described with reference to FIGS. 14 and 15. FIGS. 14 and 15 are a cross-sectional view showing processes of manufacturing a semiconductor device. Illustration and description of processes up to the formation of the side wall protective film for protecting the gate insulating film are omitted because the processes are the same (FIG. 10) as in Embodiment 1.

As shown in FIG. 14, after etching the gate insulating film at the bottom of the gate opening, the second source layer 2b is etched by using, for example, an RIE method to form the recess 3a of a square prism shape.

As shown in FIG. 15, the RIE damage layer on the surface of the protective film 21 and the recess 3a is then removed by etching. For example, acid-based or alkali-based etching solution is used in the etching method. As a result of the formation of the recess 3a, the projection-shaped gate insulating film protrusion 6a is formed in the gate insulating film 6 at the edge of the semiconductor substrate 1 side. The description of the subsequent processes is omitted because the processes are the same as those in Embodiment 1.

As described above, in the semiconductor device and method of manufacturing the same of the present embodiment, the first source layer 2a is provided on the top of the semiconductor substrate 1 and in the first source layer 2a is provided the second source layer 2b having a larger depth than that of the first source layer 2a and the recess 3a of a square pyramid shape on the top surface side. On the recess 3a, the gate opening is provided so as to penetrate the first interlayer insulating film 4a, the gate electrode film 5 and the second interlayer insulating film 4b which are laminated. The gate insulating film 6 is provided on the side surface of the gate opening. The projection-shaped gate insulating film protrusion 6a is provided at a contact portion between the first interlayer insulating film 4a and the recess 3a. The third source layer 2d, the channel 7 and the drain layer 8 are buried in a laminated structure in the gate opening which is provided with the gate insulating film 6 on the side surface thereof. The gate insulating film 6 which is formed on the side surface of the gate opening is covered by the protective film 21 until an amorphous silicon film is buried in the gate opening.

Accordingly, the source contact area can be increased than before, resulting in reduction in the source contact resistance of a vertical transistor. Also, the gate insulating film 6 is protected by the protective film 21 during processes, resulting in reduction in damage on the gate insulating film.

The present invention is not limited to the above embodiments and may be modified in various manners within a scope that does not depart from the gist of the invention.

For example, in the present embodiment, a vertical transistor with a single layer gate is described in detail. Alternatively, the invention can be applied to a stacked gate vertical transistor. In Embodiments 1 and 2, the cross-section surface of the gate opening is vertically shaped, and may alternatively be shaped in a tapered shape or in an inversely tapered shape. In Embodiment 2, the second source layer 2b is formed after forming the gate opening by using an RIE method. Alternatively, the second source layer 2b may be formed after etching the gate insulating film at the bottom of the gate opening.

What is claimed is:

1. A semiconductor device comprising
a semiconductor substrate;
a first conductive layer provided on a surface of the semiconductor substrate and serving as one of a source and a drain;
a first interlayer insulating film provided on the first conductive layer;
a gate electrode film provided on the first interlayer insulating film;
a second interlayer insulating film provided on the gate electrode film;
a gate opening provided so as to penetrate the second interlayer insulating film, the gate electrode film and the first interlayer insulating film to expose a part of the first conductive layer;
a recess provided in the surface of the first conductive layer just below the gate opening;
a gate insulating film provided on the side surface of the gate opening and having a projecting shape at a portion between the first interlayer insulating film and the recess;
a second conductive layer buried in the recess and in a bottom of the gate opening so as to be in contact with the gate insulating film, and serving as the one of the source and the drain while being in contact with the first conductive layer;
a channel which is buried in the gate opening above the second conductive layer so as to face the gate electrode film with the gate insulating film therebetween, and which has a channel layer generated therein, the channel layer allowing majority carriers to flow between the source and the drain in response to a voltage applied to the gate;
a third conductive layer buried in the gate opening above the channel so as to be in contact with the gate insulating film to serve as the other one of the source and the drain; and
a fourth conductive layer of the same conductivity type as that of the first conductive layer, the fourth conductive layer provided on the side surface of and near the bottom of the recess so as to be in contact with the first and second conductive layers.

2. The semiconductor device according to claim 1, wherein the fourth conductive layer has a higher concentration than the first conductive layer and a larger diffusion depth than the first conductive layer.

3. A semiconductor device comprising:
a semiconductor substrate;
a first conductive layer provided on a surface of the semiconductor substrate and serving as one of a source and a drain;
a first interlayer insulating film provided on the first conductive layer;
a gate electrode film provided on the first interlayer insulating film;
a second interlayer insulating film provided on the gate electrode film;
a gate opening provided so as to penetrate the second interlayer insulating film, the gate electrode film and the first interlayer insulating film to expose a part of the first conductive layer;
a recess provided in the surface of the first conductive layer just below the gate opening;
a gate insulating film provided on the side surface of the gate opening and having a projecting shape at a portion between the first interlayer insulating film and the recess;
a second conductive layer buried in the recess and in a bottom of the gate opening so as to be in contact with the gate insulating film, and serving as the one of the source and the drain while being in contact with the first conductive layer;
a channel which is buried in the gate opening above the second conductive layer so as to face the gate electrode film with the gate insulating film therebetween, and which has a channel layer generated therein, the channel layer allowing majority carriers to flow between the source and the drain in response to a voltage applied to the gate; and
a third conductive layer buried in the gate opening above the channel so as to be in contact with the gate insulating film to serve as the other one of the source and the drain,
wherein the recess has a shape of a polygonal pyramid whose bottom surface is parallel to the surface of the semiconductor substrate and whose top is located inside the semiconductor substrate.

4. The semiconductor device according to claim 3, wherein the surface of the semiconductor substrate is a (111) surface and the polygonal pyramid is a square pyramid with inclined planes of (100) surfaces.

5. A semiconductor device comprising:
a semiconductor substrate;
a first conductive layer provided on a surface of the semiconductor substrate and serving as one of a source and a drain;
a first interlayer insulating film provided on the first conductive layer;
a gate electrode film provided on the first interlayer insulating film;
a second interlayer insulating film provided on the gate electrode film;
a gate opening provided so as to penetrate the second interlayer insulating film, the gate electrode film and the first interlayer insulating film to expose a part of the first conductive layer;

a recess provided in the surface of the first conductive layer just below the gate opening;

a gate insulating film provided on the side surface of the gate opening and having a projecting shape at a portion between the first interlayer insulating film and the recess;

a second conductive layer buried in the recess and in a bottom of the gate opening so as to be in contact with the gate insulating film, and serving as the one of the source and the drain while being in contact with the first conductive layer;

a channel which is buried in the gate opening above the second conductive layer so as to face the gate electrode film with the gate insulating film therebetween, and which has a channel layer generated therein, the channel layer allowing majority carriers to flow between the source and the drain in response to a voltage applied to the gate; and a third conductive layer buried in the gate opening above the channel so as to be in contact with the gate insulating film to serve as the other one of the source and the drain, wherein the recess has a shape of a prism whose bottom surface is parallel to the surface of the semiconductor substrate.

* * * * *